(12) United States Patent
Schwarzenbach et al.

(10) Patent No.: US 9,190,284 B2
(45) Date of Patent: Nov. 17, 2015

(54) PROCESS FOR TREATING A SEMICONDUCTOR-ON-INSULATOR STRUCTURE FOR IMPROVING THICKNESS UNIFORMITY OF THE SEMICONDUCTOR LAYER

(71) Applicant: Soitec, Crolles (FR)

(72) Inventors: Walter Schwarzenbach, Saint Nazaire Les Eymes (FR); Carine Duret, Grenoble (FR); Francois Boedt, Meylan (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/397,287

(22) PCT Filed: May 1, 2013

(86) PCT No.: PCT/IB2013/000857
§ 371 (c)(1),
(2) Date: Oct. 27, 2014

(87) PCT Pub. No.: WO2013/175278
PCT Pub. Date: Nov. 28, 2013

(65) Prior Publication Data
US 2015/0118764 A1    Apr. 30, 2015

(30) Foreign Application Priority Data

May 25, 2012 (FR) ..................................... 12 54841

(51) Int. Cl.
*H01L 21/306* (2006.01)
*H01L 21/66* (2006.01)
*H01L 21/762* (2006.01)

(52) U.S. Cl.
CPC .... *H01L 21/30604* (2013.01); *H01L 21/76251* (2013.01); *H01L 22/12* (2013.01); *H01L 22/20* (2013.01)

(58) Field of Classification Search
CPC ................... H01L 21/30604; H01L 21/76251
USPC ........................................................... 438/5
See application file for complete search history.

(56) References Cited

U.S. PATENT DOCUMENTS 6,403,450 B1 * 6/2002 Maleville et al. ............. 438/471
2002/0052066 A1   5/2002 Ipposhi et al.
(Continued)

FOREIGN PATENT DOCUMENTS

EP    525781 A2   12/1998
FR   2788374 A1    7/2000

OTHER PUBLICATIONS

International Search Report for International Application No. PCT/IB2013/000857 dated Jul. 2, 2013, 5 pages.
(Continued)

*Primary Examiner* — Colleen A Matthews
*Assistant Examiner* — Regan J Rundio
(74) *Attorney, Agent, or Firm* — TraskBritt

(57) ABSTRACT

The invention relates to a process for treating a structure of semiconductor-on-insulator type successively comprising a support substrate, a dielectric layer and a semiconductor layer having a thickness of less than or equal to 100 nm, the semiconductor layer being covered with a sacrificial oxide layer, comprising measuring, at a plurality of points distributed over the surface of the structure, the thickness of the sacrificial oxide layer and of the semiconductor layer, so as to produce a mapping of the thickness of the semiconductor layer and to determine, from the measurements, the average thickness of the semiconductor layer, selective etching of the sacrificial oxide layer so as to expose the semiconductor layer, and carrying out a chemical etching of the semiconductor layer, the application, temperature and/or duration conditions of which are adjusted as a function of the mapping and/or of the mean thickness of the semiconductor layer, so as to thin, at least locally, the semiconductor layer by a thickness identified as being an overthickness at the end of the measurement step.

28 Claims, 4 Drawing Sheets

(56) References Cited

U.S. PATENT DOCUMENTS

| | | | |
|---|---|---|---|
| 2004/0060900 A1* | 4/2004 | Waldhauer et al. | 216/2 |
| 2004/0087042 A1* | 5/2004 | Ghyselen et al. | 438/5 |
| 2006/0014363 A1* | 1/2006 | Daval et al. | 438/455 |
| 2006/0097355 A1 | 5/2006 | Bauer et al. | |
| 2006/0177991 A1* | 8/2006 | Murakami et al. | 438/455 |
| 2008/0153257 A1* | 6/2008 | Kononchuk | 438/455 |
| 2009/0227047 A1* | 9/2009 | Yang et al. | 438/8 |

OTHER PUBLICATIONS

Deal et al, General Relationship for the Thermal Oxidation of Silicon, Journal of Applied Physics, vol. 36, No. 12, Dec. 1965, pp. 3770-3778.

* cited by examiner

PROCESS FOR TREATING A SEMICONDUCTOR-ON-INSULATOR STRUCTURE FOR IMPROVING THICKNESS UNIFORMITY OF THE SEMICONDUCTOR LAYER

CROSS-REFERENCE TO RELATED APPLICATIONS

This application is a national phase entry under 35 U.S.C. §371 of International Patent Application PCT/IB2013/000857, filed May 1, 2013, designating the United States of America and published in English as International Patent Publication WO 2013/175278 A1 on Nov. 28, 2013, which claims the benefit under Article 8 of the Patent Cooperation Treaty and under 35 U.S.C. §119(e) to France Patent Application Serial No. 1254841, filed May 25, 2012, the disclosure of each of which is hereby incorporated herein in its entirety by this reference.

TECHNICAL FIELD

The present invention relates to a process for treating a structure of semiconductor-on-insulator type successively comprising a support substrate, a dielectric layer and a semiconductor layer having a thickness of less than or equal to 100 nm, with a view to standardizing the thickness of the semiconductor layer.

BACKGROUND

In structures of semiconductor-on-insulator (SeOI) type, a buried dielectric layer electrically insulates the semiconductor layer from the support substrate.

In the case where the material of the dielectric layer is silicon dioxide ($SiO_2$), the buried dielectric layer is generally denoted by the acronym BOX of the term "Buried OXide."

In partially depleted (PD) SeOI structures, the thickness of the buried dielectric layer is generally greater than 100 nm and is, thus, sufficient to ensure the electrical integrity and the quality of the layer. The thickness of the semiconductor layer is then typically between 100 nm and 200 nm.

On the other hand, in fully depleted (FD) SeOI structures, the semiconductor layer has an ultrathin thickness, that is to say, of less than or equal to 50 nm, typically of the order of 12 nm and which may be reduced down to around 5 nm. In order to benefit from the proven advantages of the rear face polarization of the channel, the thickness of the buried dielectric layer may also be reduced, by a typical thickness of the order of 150 nm, down to values of less than 50 nm, typically 25 nm, and which may drop down to 5 nm.

Such structures are in particular intended for the manufacture of transistors, the channel layer being formed in or on the ultrathin semiconductor layer, which is not doped.

Owing to the ultrathin thickness of the buried dielectric layer and of the semiconductor layer, these FD SeOI structures have the advantage of enabling a precise control of the channel of the transistor, of improving the short channel effect and of reducing the variability of the transistor.

For FD SeOI transistors, the total variability results from the gate line edge roughness (LER) from the variability of the work function and from the thickness of the channel.

In so far as the channel is not doped, the total variability is not subjected to random dopant fluctuation (RDF).

Consequently, the uniformity of the thickness of the semiconductor layer forming the channel is an important parameter for limiting the variability of an FD SeOI device.

In this regard, the specifications include both an "intra-wafer" uniformity (that is to say, on the surface of one and the same structure, the structure generally being in the form of a circular wafer) and a "wafer-to-wafer" uniformity (that is to say, between all of the structures belonging to all of the production batches).

The combination of these two uniformity conditions is denoted by the expression layer total thickness variability (LTTV), and influences the parameters of the process for manufacturing FD SeOI structures in order to obtain the desired uniformity.

Thus, for FD SeOI applications, a total thickness variability of the semiconductor layer of the order of ±0.5 nm is targeted, preferably with the order of ±0.2 nm wafer-to-wafer, that is to say, between the various structures resulting from all of the production batches.

International Patent Publication WO 2004/015759 relates to a process for correcting the thickness of the semiconductor layer of an SeOI structure based on a selective sacrificial oxidation of the layer.

Depending on the processing conditions, the sacrificial oxidation consumes a greater or lesser thickness of the semiconductor layer.

The sacrificial oxide layer is then removed by selective etching, typically using hydrofluoric acid (HF).

However, the structures that are the subject of this process are not only FD SeOI structures but "conventional" PD SeOI structures.

Furthermore, the order of magnitude of the accuracy of the thinning obtained by the sacrificial oxidation in equipment of "batch" type, that is to say, equipment (for example, an oven) in which a plurality of structures are treated simultaneously, is greater than the accuracy according to which it is desired to control the uniformity on an FD SeOI structure.

Indeed, since the temperature is not completely uniform in the equipment, the oxidized thickness may vary within one and the same structure and/or from one structure to the next.

Thus, at the end of such a thinning operation, a variation of ±1 nm to 1.5 nm on average of the thickness of the semiconductor layer is obtained.

FIG. 1 illustrates the distribution of the mean thickness $e_{mean}$ compared to a target thickness $e_t$ of the semiconductor layer that may be obtained at the end of a sacrificial oxidation process as described above and as applied to the manufacture of PD SeOIs.

It is, therefore, necessary to define a process for controlling the mean thickness of the semiconductor layer that is particularly adapted to the accuracy desired for the layers of FD SeOI structures.

One objective of the invention is, therefore, to provide a process for treating structures of semiconductor-on-insulator type for "fully depleted" applications that make it possible to standardize the thickness of the semiconductor layer between various structures over the whole of a production volume (wafer-to-wafer thickness).

Such a process must be able to be implemented on an industrial scale by modifying as little as possible of the existing SeOI manufacturing processes.

The process must also be able to be carried out with commercially available and inexpensive means.

Another objective of the invention is to provide a process for manufacturing structures of semiconductor-on-insulator type that makes it possible to guarantee a good uniformity of the structures produced.

BRIEF SUMMARY

Proposed in accordance with the invention is a process for treating a structure of semiconductor-on-insulator type successively comprising a support substrate, a dielectric layer and a semiconductor layer having a thickness of less than or equal to 100 nm, the semiconductor layer being covered with a sacrificial oxide layer, the process being characterized in that it comprises:

measuring, at a plurality of points distributed over the surface of the structure, the thickness of the sacrificial oxide layer and of the semiconductor layer, so as to produce a mapping of the thickness of the semiconductor layer and to determine, from the measurements, the average thickness of the semiconductor layer, selective etching of the sacrificial oxide layer so as to expose the semiconductor layer, and carrying out a chemical etching of the semiconductor layer, the application, temperature and/or duration conditions of which are adjusted as a function of the mapping and/or of the mean thickness of the semiconductor layer, so as to thin, at least locally, the semiconductor layer by a thickness identified as being an overthickness at the end of the measurement step.

According to one implementation of the invention, which aims to standardize the thickness of the semiconductor layer between various wafers of one and the same batch, this process is applied to the batch of semiconductor-on-Insulator structures.

To that effect, at the end of the thickness measurement, the structures are sorted by mean thickness class of the semiconductor layer (a class being defined as being a mean thickness range between a given lower limit and a given upper limit), and a chemical etching is carried out under identical conditions for all the structures belonging to one and the same class.

Advantageously, the Chemical etching is carried out by simultaneously immersing all the structures of one and the same class in a bath of a chemical etching solution.

For example, from 3 to 6 mean thickness classes are defined beforehand, it being possible for the mean thickness classes to have a width of from 0.3 nm to 0.5 nm.

According to another implementation of the invention, which aims to standardize the thickness of the semiconductor layer within one structure, starting from the mapping of the thickness of the semiconductor layer, at least one region is determined that has an overthickness to be thinned in order to standardize the thickness of the semiconductor layer within the structure.

According to one embodiment, during the chemical etching of the semiconductor layer the at least one region to be thinned of the layer is heated locally so as to provide a greater thinning in the region.

According to one embodiment, optionally combined with the preceding one, the chemical etching solution is distributed selectively by a jet over the surface of the semiconductor layer, so as to deposit a greater amount of solution on the at least one region to be thinned.

According to one embodiment, optionally combined with one and/or the other of the preceding two embodiments, during the chemical etching of the semiconductor layer, the etching solution is applied to the region to be thinned for a duration greater than the duration of application to the rest of the layer.

According to another implementation of the invention, which aims to standardize the thickness of the semiconductor layer between wafers of different batches manufactured by one and the same process, at the end of the thickness measurement, the mean thickness of the semiconductor layer for the batch is calculated, a mean thickness class is allocated to the batch, and a chemical etching of the semiconductor layer is carried out for the whole of the batch, the application, temperature and/or duration conditions of which chemical etching are adjusted as a function of the mean thickness class.

According to one preferred embodiment of the invention, the chemical etching of the semiconductor layer is of SC1 type (acronym for the term "Standard Clean 1").

Advantageously, the selective etching of the sacrificial oxide layer is carried out by hydrofluoric acid.

The thickness measurement is preferably carried out by ellipsometry.

Another subject relates to a process for manufacturing a structure of semiconductor-on-insulator type successively comprising a support substrate, a dielectric layer and a semiconductor layer having a thickness of less than or equal to 100 nm.

The process comprises the following steps:

providing a substrate, referred to as a donor substrate, comprising the semiconductor layer, forming at least one dielectric layer on the semiconductor layer and/or on the support substrate, adhesive bonding of the support substrate to the semiconductor layer of the donor substrate, the at least one dielectric layer being at the bonding interface, so as to form the dielectric layer of the semiconductor-on-insulator structure, transferring the semiconductor layer to the support substrate, smoothing of the semiconductor layer, forming a sacrificial oxide layer on the semiconductor layer, and carrying out, on the structure thus formed, a treatment as defined above.

BRIEF DESCRIPTION OF THE DRAWINGS

Other features and advantages of the invention will emerge from the detailed description that follows, with reference to the appended drawings in which.

DETAILED DESCRIPTION

Figure 2:
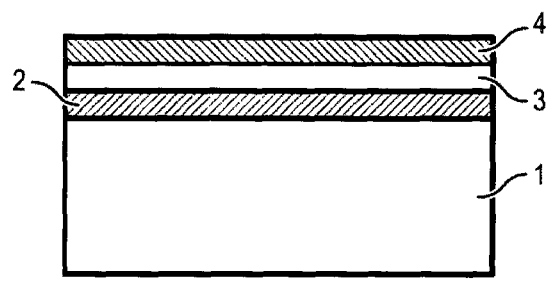
FIG. 2 is a diagram of a structure of semiconductor-on-insulator type to which the treatment according to the invention is applied, FIGS. 3A to 3E schematically illustrate the main steps of the SMARTCUT® process that makes it possible to manufacture the structure.

FIG. 2 schematically illustrates a structure of semiconductor-on-insulator type to which the treatment for standardizing the semiconductor layer is applied.

To facilitate the illustration, the respective thicknesses of the various layers have not been represented to scale.

The structure successively comprises a support substrate 1, a dielectric layer 2 and a semiconductor layer 3.

The support substrate 1 mainly acts as a mechanical support for the semiconductor layer 3, which is very thin.

The support substrate 1 may or may not be made of a semiconductor material (for example, silicon).

The support substrate 1 may be a solid substrate or a composite substrate, that is to say, consisting of a stack of various materials.

The dielectric layer 2 may be made of any dielectric material, such as a layer of silicon dioxide, a layer of nitrided silicon dioxide, a layer of silicon oxynitride, and/or a stack of layers of silicon dioxide, of silicon nitride and/or of alumina.

According to one particular embodiment of the invention, the dielectric layer 2 is ultrathin, that is to say, that its thickness is less than or equal to 150 nm, preferably less than or equal to 50 nm, more preferably less than or equal to 25 nm, or even of the order of 5 nm.

The semiconductor layer 3 is made of a semiconductor material.

Preferably, the semiconductor layer 3 is made of silicon (in which case the structure is denoted by the acronym SOI (for the expression silicon-on-insulator), but it may also be made of strained silicon (sSi), of silicon-germanium (SiGe), of strained silicon-germanium (sSiGe), of germanium, of strained germanium (sGe) or of a semiconductor material from group III-V.

The thickness of the semiconductor layer 3 prior to the treatment is less than 100 nm.

In so far as it is desired to form a structure of the FD SeOI type, for which the thickness of the semiconductor layer is less than or equal to 50 nm, typically of the order of 12 nm and which may be reduced to around 5 nm, a semiconductor layer is initially formed that is thicker than the targeted final thickness taking into account the removal of material caused by the thinning.

Such a structure may advantageously be manufactured by the SMARTCUT® process, the steps of which are illustrated with reference to FIGS. 3A to 3D.

Figure 3A:
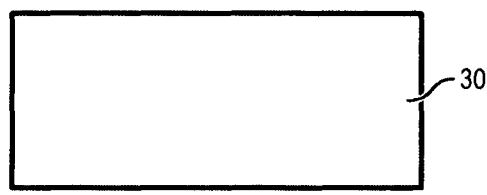

As illustrated in FIG. 3A, a substrate 30, referred to as a donor substrate, comprising the semiconductor layer 3 is provided.

The donor substrate 30 may be a solid substrate of the same material as that of the semiconductor layer 3, or a solid substrate of a material different from that of the semiconductor layer 3, or else may be a composite substrate comprising at least two layers of different materials, one of which comprises the layer 3.

Figure 3B:
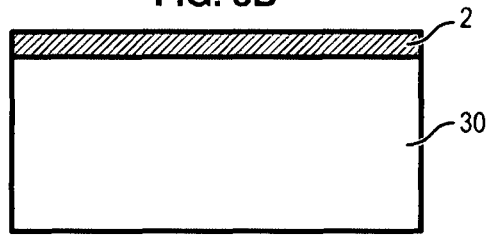

With reference to FIG. 3B, a layer 2 of a dielectric material is formed on the donor substrate 30. The dielectric layer 2 will form all or part of the dielectric layer of the SeOI structure.

Figure 3C:
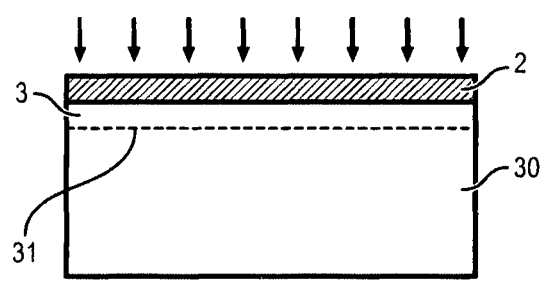

With reference to FIG. 3C, atomic species are introduced into the donor substrate 30, through the dielectric layer 2, so as to form, at a depth corresponding to the desired thickness of the layer 3, a weakened zone 31.

Preferably, the introduction of species is carried out by implantation.

Figure 3D:
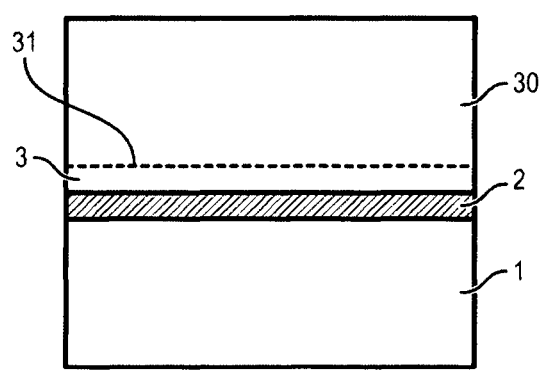

In reference to FIG. 3D, the donor substrate 30 is adhesively bonded, by the face through which the species were introduced, to the support substrate 1.

Prior to the bonding, surface cleaning and/or activation steps that aim to increase the bonding energy, which are known to a person skilled in the art, may be carried out.

The support substrate 1 may optionally be covered with a dielectric layer, for example, an oxide layer (not illustrated).

In this case, this dielectric layer and the dielectric layer formed on the donor substrate 30 together form the buried dielectric layer 2 of the SeOI structure.

Naturally, any process other than the SMARTCUT® process comprising a step of thinning the semiconductor layer 3 could be used, without departing from the scope of the present invention.

Figure 3E:
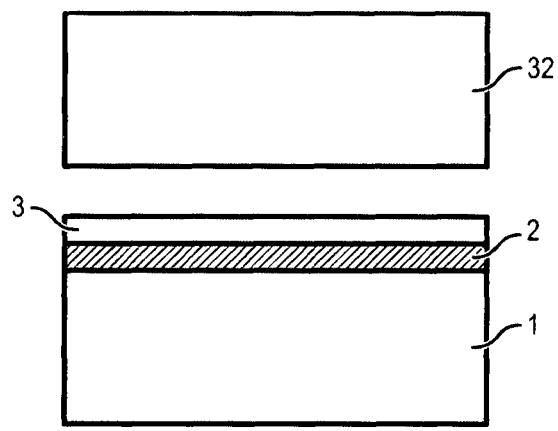

Next, as illustrated in FIG. 3E, the donor substrate 30 is fractured along the weakened zone 31, which results in the transfer of the semiconductor layer 3 to the support substrate 1, the dielectric layer 2 being at the interface.

The remainder 32 of the donor substrate 30 may advantageously be recycled with a view to other uses.

An SeOI structure is, therefore, obtained, the semiconductor layer 3 of which must also be subjected to finishing operations in order to be able to be used for the manufacture of electronic devices.

These finishing operations aim in particular to thin the thickness of the layer 3 and to reduce the roughness due to the implantation of species and to the fracture.

Thus, after the fracture, a smoothing operation of the semiconductor layer 3 is generally carried out.

Such a smoothing operation may typically be carried out by means of rapid thermal annealing (RTA).

With a view to the thinning of the semiconductor layer 3, a sacrificial oxide layer 4 is formed on the layer 3 (see FIG. 2).

This oxide is preferably formed by thermal oxidation of the material of the semiconductor layer 3, which has the effect of consuming a superficial portion of the layer 3.

This oxidation may typically be carried out by placing a batch of SeOI structures to be treated into an oven and by implementing in the oven conditions that lead to a superficial oxidation of the semiconductor layer 3.

Thus, use is made of an oxidizing atmosphere ($O_2$ or $O_2$+water vapor) and a temperature generally between 700° C. and 1200° C.

By adjusting the conditions of this thermal oxidation (in particular its duration, its composition, depending on whether the oxidation will be in a dry or wet atmosphere, its pressure and its temperature), it is possible to adjust the thickness of the layer 3, which will be consumed, and consequently the extent to which the layer 3 is thinned.

The thickness of the sacrificial oxide layer 4 is typically between 10 nm and 500 nm.

Carried out on the structure of FIG. 2, that is to say, the SeOI structure covered with the sacrificial oxide layer 4, is a measurement of the thickness of the semiconductor layer 3 at a certain number of points distributed over the surface of the structure.

According to one preferred embodiment, a measurement via ellipsometry provides not only the thickness of the sacrificial oxide layer 4, but also that of the underlying semiconductor layer 3.

Ellipsometry is a technique known per se for monitoring the correct functioning of the oxidation oven.

This technique is conventionally used for measuring the values (minimum, mean and maximum values) of the thickness of the sacrificial oxide layer and, if these values are too far apart, alerting maintenance service to adjust the control of the oven in order to standardize the thickness of the sacrificial oxide layer.

One non-limiting example of an ellipsometer suitable for this use is the machine sold under the reference ABET-F5x by the KLA-Tencor Corporation.

Reflectometry, and in particular X-ray reflectometry (generally denoted by the acronym XRR), are other appropriate techniques for measuring the thickness of the sacrificial oxide layer.

However, the inventors have observed that ellipsometry and reflectometry also made it possible to measure, with an adequate accuracy, the thickness of the semiconductor layer 3 located under the sacrificial oxide layer 4, even though the layer 4 covers the semiconductor layer 3.

In order to define the standardization treatment to be applied to the semiconductor layer 3, use is made of the measurement of the thickness of the layer 3 provided by the ellipsometer.

The measurement already regularly made for controlling the oxidation oven is, thus, taken advantage of in order to obtain supplementary information, namely the thickness of the semiconductor layer 3 at various points distributed over the surface of the structure.

Figure 4:
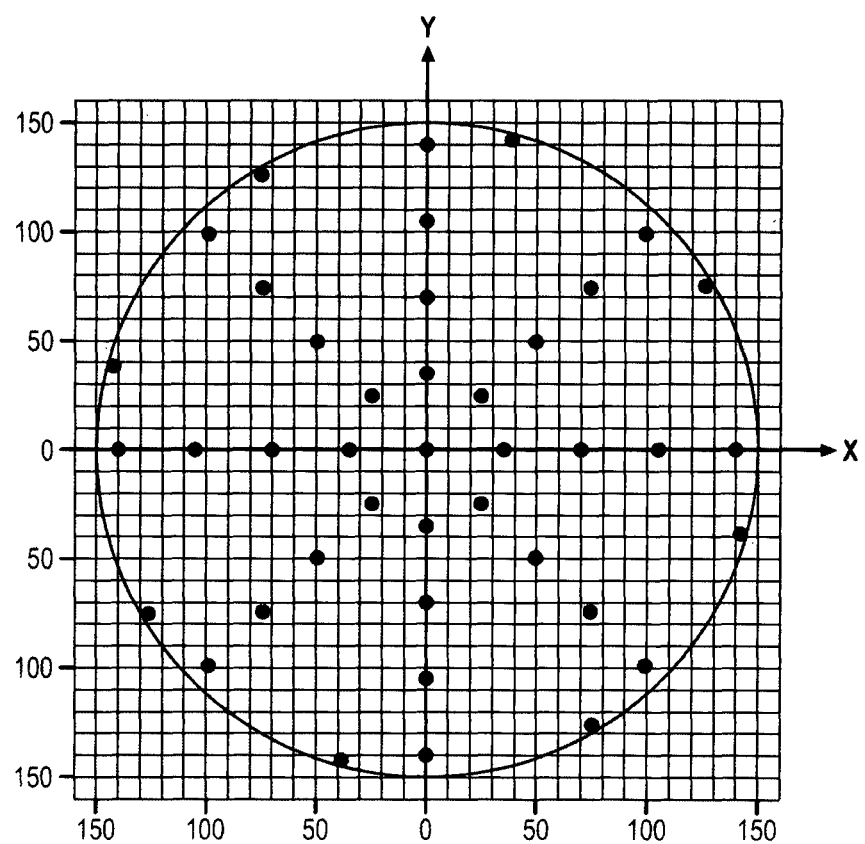
FIG. 4 presents an example of the distribution of the measurement points, measured by ellipsometry, on a semiconductor-on-insulator structure.

FIG. 4 illustrates an example of the positioning of the measurement points, measured by ellipsometry, on a circular substrate having a diameter of 300 mm. In this example, there are 41 measurement points.

A mapping of the thickness of the semiconductor layer 3 over the surface of the structure is, therefore, obtained.

From the thicknesses measured at these various points, the mean thickness of the semiconductor layer 3 is determined.

This mapping and/or this mean thickness make it possible to determine one or more regions that have overthicknesses compared to a target thickness and that must consequently be subjected to a thinning operation in order to improve the uniformity of the thickness of the semiconductor layer 3.

Depending on the case, interest is taken in the "intrawafer" uniformity (that is to say on the surface of one and the same structure, the structure generally being in the form of a circular wafer) and/or in the "wafer-to-wafer" uniformity (that is to say, between all of the structures belonging to all of the production batches).

In the case of intra-wafer uniformity, the thickness measured is compared at each point with the target thickness of the desired final product, the target thickness being less than or equal to the mean thickness.

In this case, the region(s) to be thinned is(are), therefore, the region(s) in which the thickness of the semiconductor layer 3 is greater than the target thickness, the overthickness(es) corresponding to the difference between the measured thickness and the target thickness. It is, therefore, then a question of one or more "local" overthickness(es) of the wafer.

In the case of the wafer-to-wafer uniformity, the mean of the thicknesses of the semiconductor layer 3 measured at the various measurement points are compared with a target mean thickness.

In this case, a wafer to be thinned is, therefore, a wafer for which the mean thickness of the semiconductor layer 3 is greater than the target mean thickness, the overthickness corresponding to the difference between these two mean thicknesses. It is, therefore, then a question of a "total" overthickness of the wafer.

To thin these regions in a localized manner within one wafer or to thin the wafer totally, a selective etching of the sacrificial oxide layer 4 is first carried out.

Use is made, for this purpose, of an etchant suitable for etching the sacrificial oxide without attacking the semiconductor material of the layer 3.

Typically, if the layer 4 is made of silicon oxide, hydrofluoric acid (HF) is used as etchant.

Naturally, a person skilled in the art will be able to select any other suitable etchant as a function of the respective materials of the sacrificial oxide layer and of the semiconductor layer.

Once the layer 4 is removed, a chemical etching of the semiconductor layer 3 is carried out.

According to one preferred implementation of the invention, the etching is an etching of the SC1 type.

The SC1 etching is carried out with a solution containing a mixture of ammonium hydroxide ($NH_4OH$), hydrogen peroxide ($H_2O_2$) and water ($H_2O$), in typical proportions of 1/1/1 to 4/4/1 as weight concentrations.

Advantageously, the solution is maintained at a temperature between 40° C. and 80° C.

SC1 etching has the effect of giving rise to a superficial oxidation of the semiconductor layer 3, and consequently of consuming a small thickness of the layer, while at the same time consuming the oxide thus created.

The thickness consumed depends on the composition and on the temperature of the solution and also on the amount of solution applied to the layer 3 and on the duration of the etching.

A person skilled in the art is able to determine the composition of the SC1 solution, and also the temperature and duration of application, in order to thin the semiconductor layer 3 by a desired thickness.

Typically, this consumed thickness is of the order of a few nanometers and may be controlled to within a fraction of a nanometer.

The SC1 solution is customarily used in the treatment of semiconductor substrates in order to clean their surface by eliminating the contaminants.

The etching that results from this cleaning is then an undesirable effect.

In the invention, the SC1 solution is not; however, used with a view to cleaning the semiconductor layer but with a view to etching it in order to thin it.

One advantage of using the ellipsometric measurement through the sacrificial oxide layer 4 is that it is possible to carry out the steps of HF etching and of SC1 etching directly one after the other, which simplifies the process.

If the measurement of the thickness of the semiconductor layer 3 had not been able to be made through the sacrificial oxide layer 4, it would indeed have been necessary to remove the sacrificial oxide layer 4 before measuring the thickness of the semiconductor layer 3, and only then carrying out the specific thinning via SC1, which would have given rise to more wafer handling operations.

According to one embodiment, each wafer is immersed in a bath containing the etching solution.

This embodiment is more particularly suitable for the treatment of a wafer that it is desired to thin totally, the solution having the effect of consuming a substantially uniform thickness of the semiconductor layer over the entire surface of the water.

As indicated in detail below, the conditions of this etching are not identical for all the wafers of one and the same production batch but are adjusted depending on the mean thickness of the semiconductor layer of each wafer.

Thus, according to one implementation of the invention, structures resulting from one and the same batch are sorted so as to regroup them, according to predetermined mean thickness classes.

For example, five mean thickness classes are defined, it being possible for the two extreme classes to be devoid of a lower limit and an upper limit, and the intermediate classes defining mean thickness ranges of equal amplitude, of a few fractions of nanometers of amplitude, for example, from 0.3 nm to 0.5 nm of amplitude.

Applied next, to all of the wafers of one and the same class, is an identical SC1 etching, but which is different from the etching applied to the wafers of another class.

For this purpose, the wafers of one and the same class are simultaneously submerged in one and the same bath of a solution of SC1.

Purely by way of indication, the table below indicates, for five mean thickness classes, the duration of the SC1 etching and the thickness of the semiconductor layer (which, in this example, is made of silicon) consumed by the treatment, which is determined experimentally.

| Mean thickness x (A) | Class | Duration of the SC1 etching(s) | Theoretical thickness consumed (A) |
|---|---|---|---|
| <734 | 1 | 202 | −22.9 |
| 734 < x < 738 | 2 | 237 | −26.9 |
| 738 < x < 746 | 3 | 272 | −30.9 |
| 742 < x < 746 | 4 | 308 | −34.9 |
| >746 | 5 | 344 | −38.9 |

In the example given above, the SC1 etching only differs between two classes by its duration, but it goes without saying that it is also possible to vary other parameters of this etching, such as the temperature, the composition of the solution, etc., as a function of the thickness that it is desired to consume.

The number and the amplitude of the mean thickness classes are defined by a person skilled in the art as a function of the specifications of the wafers, of the industrial stresses (each class being associated with an etching under different conditions), etc.

According to one implementation variant, it is possible to dispense with the grouping of the wafers into various classes.

For this purpose, after having carried out a first sequence of HF etching then of SC1 etching on all of the wafers of one and the same batch (in an undifferentiated manner for all these structures) so as to remove the sacrificial oxide layer 4, the thickness of the semiconductor layer 3 is measured, for example, by ellipsometry.

The average of the mean thicknesses measured for all of the wafers of the batch is then calculated and, depending on the value thus obtained, all of the wafers of the batch are allocated to a predetermined class.

Applied then to all of these wafers is the SC1 etching defined for the class in question.

Figure 5:
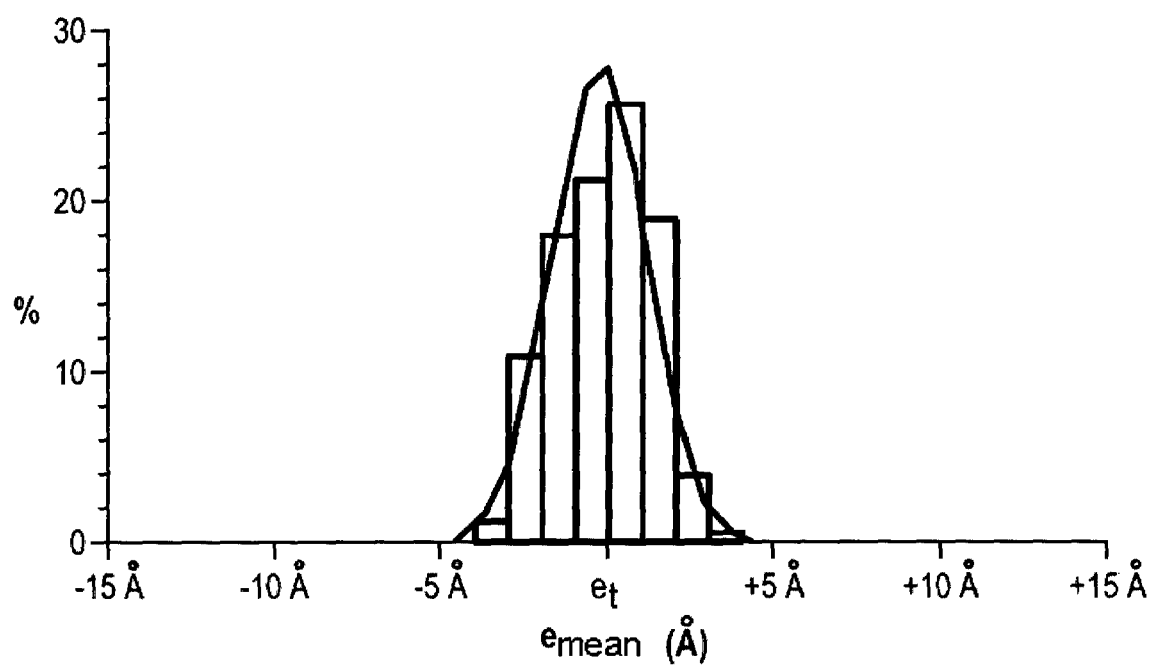
FIG. 5 presents the distribution of the mean thickness of the semiconductor layer of a structure of FD SeOI type at the end of the treatment according to the invention.

FIG. 5 illustrates the distribution of the mean thickness $e_{mean}$ of the semiconductor layer relative to a target thickness $e_t$. The Y-axis indicates the percentage of wafers having a given thickness of the semiconductor layer.

Figure 1:
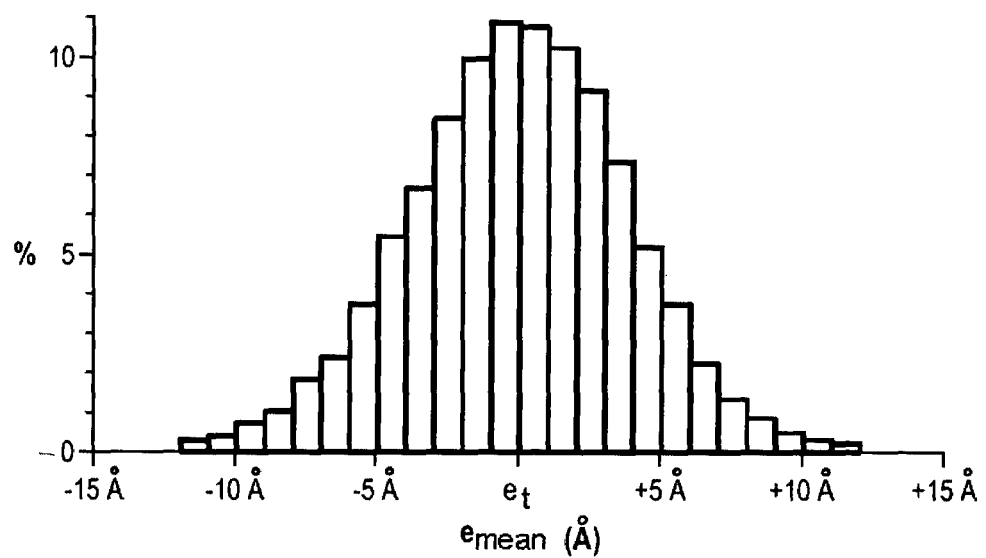
FIG. 1 presents the distribution of the mean thickness of the semiconductor layer of a structure of PD SeOI type.

Compared to the distribution presented in FIG. 1, the distribution obtained with the process described above is much narrower since it provides a variability of less than or equal to ±0.5 nm, or even less than or equal to ±0.2 nm compared to the target thickness.

When it is desired to standardize the thickness of the semiconductor layer within one and the same wafer, the conditions of the SC1 etching are adjusted in order to locally thin the region(s) identified as having an overthickness, from the mapping described above.

According to one embodiment, an etching solution is sprayed over each wafer, for example, using a movable nozzle.

This makes it possible to adjust the amount of solution applied to the surface of the wafer as a function of the amplitude of the overthickness to be eliminated.

Thus, if a wafer comprises a first region having a first overthickness and a second region having a second overthickness less than the first, it is possible to spray onto the first region an amount of solution greater than the amount sprayed onto the second, which is itself greater than the amount optionally sprayed onto the remainder of the surface.

Owing to this selective provision, a greater thinning is obtained in the first region than in the second.

According to another embodiment, optionally combined with the preceding one, the duration of application of the etching solution is also adjusted.

Thus, the solution is applied for a greater duration in the region that has the greatest overthickness.

According to another embodiment, optionally combined with one and/or the other of the two preceding embodiments, the application temperature of the etching solution is also adjusted.

Thus, the wafer is locally heated in the region(s) which has(have) overthicknesses. This localized heating can be carried out typically by a localized infrared heating device, as described, for example, in French Patent No. FR 2 912 839.

Such a heating has the effect of intensifying the effect of the etching and of consuming a greater amount of the semiconductor material of the layer 3.

The invention claimed is:

1. A method of treating a semiconductor-on-insulator (SeOI) structure successively comprising a support substrate, a dielectric layer and a semiconductor layer having a thickness of less than or equal to 100 nm, the semiconductor layer being covered with a sacrificial oxide layer, the method comprising:
   measuring, at a plurality of points distributed over a surface of the SeOI structure, a thickness of the sacrificial oxide layer and a thickness of the semiconductor layer and producing a map of the thickness of the semiconductor layer and determining an average thickness of the semiconductor layer from the measurements,
   selectively etching the sacrificial oxide layer and exposing the semiconductor layer, and
   chemically etching the semiconductor layer, and adjusting at least one of an application of an etchant of the etching process, a temperature of the etching process, and a duration of the etching process as a function of the mapping and/or of the mean thickness of the semiconductor layer and thinning, at least locally, the semiconductor layer by a thickness identified as being an overthickness at the end of the measuring process.

2. The method of claim 1, further comprising applying the method of claim 1 to a batch of SeOI structures, further comprising, at the end of the measuring process, sorting the SeOI structures by the mean thicknesses of the semiconductor layers into classes, and wherein the chemical etching is carried out under identical conditions for all the SeOI structures belonging to the same class.

3. The method of claim 2, wherein the Chemical etching comprises simultaneously immersing all the SeOI structures of the same class in a bath of a chemical etching solution.

4. The method of claim 3, wherein the classes include 3 to 6 individual classes defined prior to the sorting of the SeOI structures.

5. The method of claim 4, wherein the classes have a width of from 0.3 nm to 0.5 nm.

6. The method of claim 1, wherein the measuring comprises identifying at least one region of the semiconductor layer having an overthickness, and wherein the chemical etching comprises selectively thinning the at least one region relative to another region of the semiconductor layer.

7. The method of claim 6, wherein selectively thinning the at least one region comprises locally heating the at least one region during the chemical etching of the semiconductor layer.

8. The method of claim 6, wherein selectively thinning the at least one region comprises selectively distributing a chemical etching solution over a surface of the semiconductor layer and depositing a greater amount of the chemical etching solution on the at least one region relative to the another region of the semiconductor layer.

9. The method of claim 8, wherein selectively distributing the chemical etching solution over the surface of the semiconductor layer comprises applying the chemical etching solution to the at least one region for a duration of time greater than a duration of time to which the chemical etching solution is applies to the another region of the semiconductor layer.

10. The method of claim 1, further comprising successively applying the method of claim 1 to batches of SeOI structures, calculating a mean thickness of the semiconductor layers in one of the batches, allocating a mean thickness class to the one of the batches, and carrying out the chemical etching the semiconductor layers of the SeOI structures in the one of the batches and adjusting at least one of an application of an etchant of the etching process, a temperature of the etching process, and a duration of the etching process as a function of the mean thickness class allocated to the one of the batches.

11. The method of claim 1, wherein the chemical etching of the semiconductor layer is of SC1 type.

12. The method of claim 1, wherein selectively etching the sacrificial oxide layer comprises etching the sacrificial oxide layer with hydrofluoric acid.

13. The method of claim 1, wherein the measurement of the thickness of the sacrificial oxide layer and the thickness of the semiconductor layer comprises using ellipsometry to measure the thickness of the sacrificial oxide layer and the thickness of the semiconductor layer.

14. A method of manufacturing a semiconductor-on-insulator (SeOI) structure, comprising: a support substrate, a dielectric layer and a semiconductor layer, having a thickness of less than or equal to 100 nm, the method comprising:
providing a donor substrate, comprising the semiconductor layer,
forming at least one dielectric layer on at least one of the semiconductor layer and the support substrate,
bonding the support substrate to the semiconductor layer of the donor substrate, at least one dielectric layer being at the bonding interface, and
forming the dielectric layer of the SeOI structure,
transferring the semiconductor layer to the support substrate,
smoothing the semiconductor layer,
forming a sacrificial oxide layer on the semiconductor layer,
processing, being characterized in that a treatment according to one of claims 1 to 13 is carried out on the structure thus formed.

15. A method of treating a semiconductor-on-insulator (SeOI) structure successively comprising a support substrate, a dielectric layer and a semiconductor layer having a thickness of less than or equal to 100 nm, the semiconductor layer being covered with a sacrificial oxide layer, the method comprising;
measuring, at a plurality of points distributed over a surface of the SeOI structure, a thickness of the sacrificial oxide layer and a thickness of the semiconductor layer, producing a map of the thickness of the semiconductor layer, and determining an average thickness of the semiconductor layer from the measurements;
selectively etching the sacrificial oxide layer and exposing the semiconductor layer; and
chemically etching the semiconductor layer and adjusting at least one of an application of an etchant of the etching process, a temperature of the etching process, and a duration of the etching process as a function of the mapping and/or of the mean thickness of the semiconductor layer and thinning, at least locally, the semiconductor layer by a selected thickness.

16. The method of claim 15, further comprising applying the method of claim 15 to a batch of SeOI structures, and sorting the SeOI structures by the mean thicknesses of the semiconductor layers into classes, and wherein the chemical etching is carried out under identical conditions for all the SeOI structures belonging to the same class.

17. The method of claim 16, wherein the chemical etching comprises simultaneously immersing all the SeOI structures of the same class in a bath of a chemical etching solution.

18. The method of claim 17, wherein the classes include 3 to 6 individual classes defined prior to the sorting of the SeOI structures.

19. The method of claim 18, wherein the classes have a width of from 0.3 nm to 0.5 nm.

20. The method of claim 15, wherein the measuring comprises identifying at least one region of the semiconductor layer having an overthickness, and wherein the chemical etching comprises selectively thinning the at least one region relative to another region of the semiconductor layer.

21. The method of claim 20, wherein selectively thinning the at least one region comprises locally heating the at least one region during the chemical etching of the semiconductor layer.

22. The method of claim 20, wherein selectively thinning the at least one region comprises selectively, distributing a chemical etching solution over a surface of the semiconductor layer and depositing a greater amount of the chemical etching solution on the at least one region relative to the another region of the semiconductor layer.

23. The method of claim 22, wherein selectively distributing the chemical etching solution over the surface of the semiconductor layer comprises applying the chemical etching solution to the at least one region for a duration of time greater than a duration of time to which the chemical etching solution is applies to the another region of the semiconductor layer.

24. The method of claim 15, further comprising successively applying the method of claim 1 to batches of SeOI structures, calculating a mean thickness of the semiconductor layers in one of the batches, allocating a mean thickness class to the one of the hatches, and carrying out the chemical etching the semiconductor layers of the SeOI structures in the one of the batches and adjusting at least one of an application of an etchant of the etching process, a temperature of the etching process, and a duration of the etching process as a function of the mean thickness class allocated to the one of the batches.

25. The method of claim 15, wherein the chemical etching of the semiconductor layer is of SC1 type.

26. The method of claim 15, wherein selectively etching the sacrificial oxide layer comprises etching the sacrificial oxide layer with hydrofluoric acid.

27. The method of claim 15, wherein measuring the thickness of the sacrificial oxide layer and the thickness of the semiconductor layer comprises using ellipsometry to measure the thickness of the sacrificial oxide layer and the thickness of the semiconductor layer.

28. A method of manufacturing a semiconductor-on-insulator (SeOI) structure, successively comprising a support substrate, a dielectric layer and a semiconductor layer, having a thickness of less than or equal to 100 nm, the method comprising:
providing a donor substrate comprising the semiconductor layer;
forming at least one dielectric layer on at least one of the semiconductor layer and the support substrate;
bonding the support substrate to the semiconductor layer of the donor substrate, the at least one dielectric layer disposed at the bonding interface and forming the dielectric layer of the SeOI structure;

transferring the semiconductor layer to the support substrate;
smoothing a surface of the semiconductor layer;
forming a sacrificial oxide layer on the surface of the semiconductor layer;
measuring, at a plurality of points distributed over the surface of the sacrificial oxide layer, a thickness of the sacrificial oxide layer and a thickness of the semiconductor layer, and
producing a map of the thickness of the semiconductor layer and determining an average thickness of the semiconductor layer from the measurements;
selectively etching the sacrificial oxide layer and exposing the semiconductor layer; and
chemically etching the semiconductor layer and adjusting at least one of an application of an etchant of the etching process, a temperature of the etching process, and a duration of the etching process as a function of the mapping and/or of the mean thickness of the semiconductor layer and
thinning, at least locally, the semiconductor layer by a selected thickness.

\* \* \* \* \*

UNITED STATES PATENT AND TRADEMARK OFFICE
CERTIFICATE OF CORRECTION

PATENT NO. : 9,190,284 B2
APPLICATION NO. : 14/397287
DATED : November 17, 2015
INVENTOR(S) : Walter Schwarzenbach, Carine Duret and Francois Boedt It is certified that error appears in the above-identified patent and that said Letters Patent is hereby corrected as shown below:

In the specification:

| | | |
|---|---|---|
| COLUMN 6, | LINE 53, | change "use is the machine" to --use is a machine-- |
| COLUMN 7, | LINE 20, | change "(that is to say on" to --(that is to say, on-- |

In the claims:

| | | | |
|---|---|---|---|
| CLAIM 3, | COLUMN 10, | LINE 42, | change "the Chemical etching" to --the chemical etching-- |
| CLAIM 9, | COLUMN 11, | LINE 3, | change "is applies to" to --is applied to-- |
| CLAIM 10, | COLUMN 11, | LINE 8, | change "etching the" to --etching of the-- |
| CLAIM 11, | COLUMN 11, | LINE 15, | change "is of SC1 type." to --the semiconductor layer is of Standard Cleaning 1 (SC1) type.-- |
| CLAIM 14, | COLUMN 11, | LINE 40, | change "layer," to --layer; and-- |
| CLAIM 14, | COLUMN 11, | LINE 41, | change "processing, being characterized" to --the method being characterized-- |
| CLAIM 23, | COLUMN 12, | LINE 32, | change "is applies to" to --is applied to-- |
| CLAIM 24, | COLUMN 12, | LINE 38, | change "of the hatches," to --of the batches,-- |
| CLAIM 24, | COLUMN 12, | LINE 39, | change "etching the" to --etching of the-- |
| CLAIM 28, | COLUMN 13, | LINE 6, | change "over the" to --over a-- |

Signed and Sealed this
Second Day of August, 2016

Michelle K. Lee
*Director of the United States Patent and Trademark Office*